US006349454B1

(12) United States Patent
Manfra et al.

(10) Patent No.: US 6,349,454 B1
(45) Date of Patent: Feb. 26, 2002

(54) METHOD OF MAKING THIN FILM RESONATOR APPARATUS

(75) Inventors: Michael James Manfra, Short Hills; Loren Neil Pfeiffer, Morristown; Kenneth William West, Mendham; Yiu-Huen Wong, Summit, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/363,527

(22) Filed: Jul. 29, 1999

(51) Int. Cl.[7] .............................................. H01L 41/00
(52) U.S. Cl. ...................................... 29/25.35; 427/100
(58) Field of Search ....................... 29/25.35; 310/324; 427/100

(56) References Cited

U.S. PATENT DOCUMENTS

| | | | |
|---|---|---|---|
| 3,568,108 A | 3/1971 | Poirier et al. .................. 333/72 |
| 4,320,365 A | 3/1982 | Black et al. ................. 333/187 |
| 4,719,383 A | * 1/1988 | Wang et al. ................. 310/324 |
| 5,747,857 A | * 5/1998 | Eda et al. ................ 310/324 X |
| 5,821,833 A | 10/1998 | Lakin ........................... 333/187 |
| 5,864,261 A | 1/1999 | Weber ......................... 333/187 |

FOREIGN PATENT DOCUMENTS

JP          0145715     * 8/1985 ................. 310/324

OTHER PUBLICATIONS

S. V. Krishnaswamy, J. F. Rosenbaum, S. S. Horwitz and R. A. Moore, *Film Bulk Acoustic Wave Resonator and Filter Technology*, Jan. 1992, pp. 153–155.

Mathews, "A Historical Review of Epitaxy," Epitaxial Growth, Academic Press, 1975, pp. 2–27.

R. S. Naik, "Bragg Reflector Thin–Film Resonators for Miniature PCS Bandpass Filters," PhD. Thesis, Dept. of Materials Science and Engineering, MIT 1998, Chapter 2, pp. 23–32.

* cited by examiner

*Primary Examiner*—Carl E. Hall

(57) ABSTRACT

A thin film resonator (TFR) is produced with an improved piezoelectric film which is epitaxially grown on a growing surface, resulting in a piezoelectric film with less grain boundaries. Epitaxial growth refers to the piezoelectric film having a crystallographic orientation take from or emulating the crystallographic orientation of a single crystal substrate or growing surface. For example, by epitaxially growing a piezoelectric film on a single crystal silicon substrate as the growing surface, an improved piezoelectric film is produced with little or no grain boundaries. Also provided is a method of making a TFR in which the piezoelectric film is grown on a substrate. Subsequently, a portion of the substrate is removed, and the electrodes are deposited on either side of the piezoelectric film.

5 Claims, 4 Drawing Sheets

METHOD OF MAKING THIN FILM RESONATOR APPARATUS

BACKGROUND OF THE INVENTION

1. Field of The Invention

This invention relates to thin film resonators (TFRs) and a method of making TFRs.

2. Description of Related Art

TFRs are thin film acoustic devices which can resonate in the radio frequency to microwave range, for example, 0.5 to 5 Gigahertz (GHz), in response to an electrical signal. FIG. 1 shows a typical TFR 10 with a piezoelectric film 12 between a first electrode 14 and a second electrode 16 which apply an electric field to the piezoelectric film 12. The film 12 is made of a piezoelectric crystalline material, such as zinc oxide, aluminum nitride (AlN) and other piezoelectric crystalline material, which exhibits a piezoelectric effect. The piezoelectric effect occurs when the piezoelectric material expands or contracts in response to an electric field applied across the piezoelectric material, for example by the first and second electrodes 14 and 16, or produces an electric field in response to mechanical stress or strain applied to the piezoelectric material. If the electric field across the film 12 is an alternating electric field having frequency components corresponding to resonant frequencies (e.g., a fundamental frequency and harmonics), the fundamental frequency of which is defined for a film of uniform thickness as the acoustic velocity (v) in the film 12 divided by two (2) times the thickness (t) of the film or $f_r = v/2t$. The film 12 will mechanically vibrate at the resonant frequencies which in turn produces an alternating electric field at the resonant frequencies.

The first and second electrodes 14 and 16 are typically of metal, such as aluminum. The acoustic impedance mismatch between the first electrode 14 and the air creates a first acoustic reflecting surface 18 at the interface between the top surface of the first electrode 14 and the air. A second acoustic reflecting surface 22 can be established at an interface between the second electrode 16 and a substrate 24 (or air if a portion of the substrate 24 under the film 12 is removed). Alternatively, acoustic reflecting layer(s) can be created between the second electrode 16 and the substrate 24 to suppress unwanted frequencies, such as harmonics of the fundamental frequency. The acoustic reflecting layer(s) can be formed from a material having desired characteristic acoustic impedance(s) and with the proper dimensions to provide desired reflection characteristics for the second reflecting surface at the interface between the second electrode 14 and the acoustic reflecting layers. As such, the acoustic reflecting layers can reflect desired frequencies while suppressing unwanted frequencies. An acoustic cavity created between the first and second reflecting surfaces and with the proper dimensions establishes a standing wave at the resonant frequencies of the piezoelectric film 12. The dimensions of the acoustic cavity, for example the thickness of the piezoelectric film 12 and the electrodes 14 and 16, define the operating frequencies for the TFR 10. Energy outside the operating frequencies of the TFR 10 is lost, while energy within the operating frequencies is preserved.

The TFR 10 structure can be formed on the substrate 24, such as a silicon (Si), Gallium Arsenide (GaAs) or other semiconductor substrate, for monolithic integration purposes, such as integration with active semiconductor devices. For discrete applications, the TFR 10 is typically formed on other suitable substrates, such as quartz, sapphire, aluminum nitride (AlN), or silicon carbide. If the TFR 10 has acoustic reflecting layer(s), the acoustic reflecting layer(s) are formed on the substrate 24 followed by the second electrode 16 which is formed on the reflecting layer(s). If there are no acoustic reflecting layers, then the second electrode 16 is formed on the substrate 24, for example using chemical vapor deposition (CVD) or sputtering. See, Kern & Vossen, "Thin Film Processes," Vols. I and II, Wiley & Sons. The piezoelectric film 12 is then formed on the second electrode 16, and the first electrode 14 is formed on top of the piezoelectric film 12, for example using chemical vapor deposition (CVD) or sputtering. To improve the performance of the TFR 10, a portion of the substrate 24 is removed from under the second reflecting surface 22. To remove the portion of the substrate 24, the substrate 24 includes an etch stop 28, such as a boron doped p+ layer implanted in a silicon (Si) substrate, at the upper surface of the substrate 24 adjacent to the bottom of the second electrode 16. The etch stop 28 is used to protect the second electrode 16 from a chemical etch removing the portion 30 of the substrate 24.

By growing the piezoelectric film 12 on the second electrode, the resulting piezoelectric film 12 is polycrystalline in that distinct crystals having different lattice orientations are present throughout the piezoelectric film 12. Such a non-uniform or irregular crystalline structure with grain boundaries between the differently oriented crystallites or crystal grains reduces the quality of the piezoelectric film 12.

Two figures of merit are used to measure the quality of piezoelectric films: a quality factor Q and an electro-mechanical coupling coefficient. The quality factor Q for a TFR is a measure of the resonance quality of the acoustic cavity while the coupling coefficient is a measure of the efficiency of conversion between electrical and mechanical energy within the acoustic cavity. Both of these figures of merit are inversely proportional to the acoustic loss introduced by the TFR at the operating frequency band. If the piezoelectric film 10 has a polycrystalline structure with grain boundaries and other defects, such as point imperfections or dislocations in the crystal lattice, or poor reflectivity of the reflecting surfaces 18 and 22 for example due to surface roughness, acoustic losses can result from acoustic scattering within the film 12 and acoustic radiation into the surrounding areas of the device 10. Thus, if the film 12 is polycrystalline, acoustic losses will be introduced by the film 12, thereby producing a lower quality TPR.

TFRs can be used at radio frequency (RF) because piezoelectric films can be made thin, for example at higher frequencies, such as 0.5–10 GHz, the piezoelectric film 12 can be between 0.4 and 8 microns in width. Because TFRs produce an alternating electric field at the resonant frequency in response to an alternating electric field having frequency components corresponding to the resonant frequencies, TFRs can be used as radio frequency (RF) filter elements. TFR filters have a distinct size advantage over conventional RF filters, such as those based on ceramics. For example, thin film resonators can have volumes of 1.5 cubic millimeters while ceramic resonators are typically not less than hundreds of cubic millimeters in volume. At the same time, a ceramic element typically introduces more loss to the input signal at the operating frequency band than the TFR. TFR also have higher power handling capabilities than surface acoustic wave (SAW) devices, for example 200 milliwatts vs. 2 watts. As mentioned above, however, TFRs can introduce losses to an electrical signal applied to the TFR in part due to the polycrystalline structure of the film 12. Typical TFR fabricating methods produce piezoelectric films with on the order of $10^8$ distinct crystalline orientations separated by grain boundaries.

Thus, a need exists for a high quality TFR which introduces low loss to the electrical signal applied to the TFR.

SUMMARY OF THE INVENTION

The present invention involves a thin film resonator (TFR) produced with an improved piezoelectric film which is epitaxially grown on a growing surface, resulting in a piezoelectric film with less grain boundaries. Epitaxial growth refers to the piezoelectric film having a crystallographic orientation taken from or emulating the crystallographic orientation of a single crystal substrate or growing surface. For example, by epitaxially growing a piezoelectric film on a single crystal silicon substrate as the growing surface, an improved piezoelectric film is produced with little or no grain boundaries. In accordance with another aspect of the present invention, a method of making a TFR is disclosed in which the piezoelectric film is grown on a substrate. Subsequently, a portion of the substrate is removed, and the electrodes are deposited on either side of the piezoelectric film.

BRIEF DESCRIPTION OF THE DRAWINGS

Other aspects and advantages of the present invention may become apparent upon reading the following detailed description and upon reference to the drawings in which:

FIGS. 2–4a and 5–9 show the different levels of development of an embodiment of a thin film resonator (TFR) according to the principles of the present invention.

DETAILED DESCRIPTION

Figure 1:
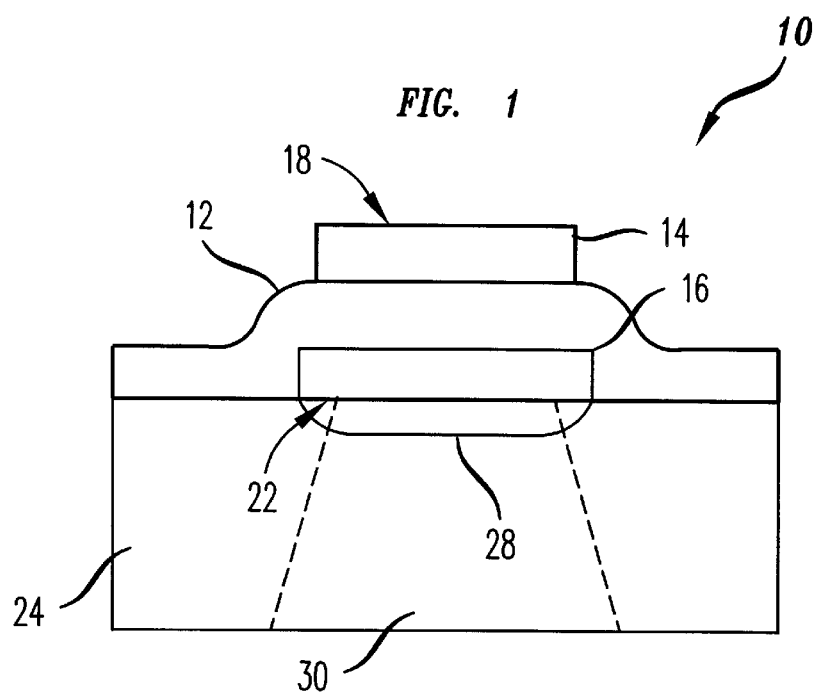
FIG. 1 shows a general block diagram of a thin film resonator.
Figure 2:
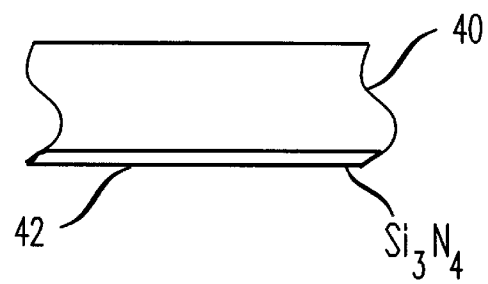

The invention is described below with respect to an exemplary embodiment of the thin film resonator (TFR) and the method of making the TFR. With particular reference to FIG. 2, a single crystal silicon (Si) substrate 40 is provided on which a piezoelectric film is epitaxially formed for the acoustic cavity of the TFR. Epitaxial growth in the context of this invention refers to the formation of a crystalline film with a crystallographic orientation taken from or emulating a single crystal substrate or an imposed template pattern on a growing surface. For instance, epitaxially forming the film with a crystallographic orientation taken from or emulating the crystallographic orientation of a single crystal substrate or pattern on a growing surface can be shown when a uniform, regular or continuous crystallographic orientation is consistently achieved for piezoelectric films formed under the same growing conditions and relative to the same substrate or surface. In certain embodiments, the piezoelectric film is epitaxially formed to have a uniform, regular or continuous crystallographic orientation based on the uniform, regular or continuous crystollographic orientation of the substrate, for example a single crystal silicon substrate. Non-epitaxial growth of the piezoelectric film typically leads to grain boundaries which contribute to acoustic energy losses within the resulting TFR and result in device degradation through aging and fatigue at the grain boundaries. The epitaxial growth results in fewer grain boundaries and improved structural integrity.

Any deviation in a crystal from a perfect periodic lattice is an imperfection. A point imperfection is localized at a point in the lattice structure and can occur due to chemical impurities, vacant lattice sites and interstitial atoms (extra atoms not in the regular lattice). A line of imperfections, such as a dislocation, is a discontinuity in the crystal lattice structure. Typically, on either side of the dislocation, the crystal orientation has the same regular periodic arrangement. Arrays of dislocations can form grain boundaries between adjoining crystallites or crystal grains which have distinct crystallographic orientations. Non-epitaxial growth typically leads to grain boundaries which produce an irregular and discontinuous crystalline orientation within the film. Grain boundaries are significant in producing losses and should be reduced to reduce losses introduced by the film to the TFR and to improve the structural integrity of the film. Other defects, such as dislocations, also contribute to losses and should also be reduced. Non-epitaxial growth of piezoelectric film for TFRs typically can have $10^8$ grain boundaries per $cm^2$ and $10^{10}$ dislocations per $cm^2$. The non-epitaxial piezoelectric film is thereby polycrystalline with a discontinuous and irregular crystalline structure, and the dislocations are typically dispersed throughout the piezoelectric film. A high quality epitaxial piezoelectric film grown on an approximately lattice-matched single crystal substrate typically has very few (for example less than 10 distinct crystallographic orientations within the film) or no grain boundaries with $10^5$–$10^{10}$ dislocations per $cm^2$ at the substrate-heteroepitaxial interface. The number of dislocations decreases by a factor of two every 2–3000 angstroms, and the dislocations are typically parallel to or along the direction of growth.

Epitaxial growth of a piezoelectric film on a substrate can be obtained when the substrate and the piezoelectric film has a crystalline structure with similar in-plane lattice parameters. For example, a film can be epitaxially grown on a substrate when the in-plane lattice mismatch between the piezoelectric film and the underlying material (the substrate upon which the piezoelectric film is being deposited) is less than 20%. Lattice mismatch is equal to [(a0/a0(substrate))−1] where a0 and a0(substrate) are respectively the in-plane lattice parameters of the deposited thin film and the material upon which the thin film is deposited.

The crystal orientation of the substrate can be varied to reduce the lattice mismatch between the parallel lattice planes of the substrate 40 and the film to be deposited on the substrate 40. For example, a Si substrate 40 with a <111> orientation can be obtained for epitaxially growing a AlN film. A substrate 40 with a <110> or <100> orientation can also be sufficient. For an explanation of how to describe different crystal orientations, see C. Kittel, "Introduction to Solid State Physics," John Wiley & Sons, Inc. (1967). Other substrates can include gallium arsenide, galium nitride and others.

By providing a substrate 40 with a uniform, continuous or regular periodic lattice structure, such as a single crystal silicon, with a suitable lattice mismatch between the piezoelectric film to be deposited and the substrate, the piezoelectric film can be epitaxially formed on the substrate 40 with a reduced number of grain boundaries. Single crystal Si substrates have zero grain boundaries and zero dislocations while a single crystal GaAs substrate has zero grain boundaries and $10$–$10^5$ dislocations per $cm^2$. Epitaxial deposition of a variety of materials is discussed in Mathews, *Epitaxial Growth,* Academic Press, 1975. In alternative embodiments, other substrates or growing surfaces, for example gallium arsenide, gallium nitride, or aluminum oxide, can be used having different, amorphous or even irregular and discontinuous crystalline orientations so long as the piezoelectric film is epitaxially formed with the desired continuous, uniform or regular crystalline orientation. For example, epitaxial growth can occur using grapho-epitaxy, where a growing surface is prepared with physical growth sites or structures, such as grooves, pits, etchings or a pattern to epitaxially form a film having a particular continuous, uniform or regular crystalline orientation. A film can be epitaxially formed over an amorphously structured material, such as an oxide (for example aluminum oxide), through lateral epitaxial growth which starts with the epitaxial formation of the film on an appropriate growing surface adjacent to the amorphous structure, and the film forms epitaxially with respect to the growing surface over the amorphous structure. See, Kern & Vossen, "Thin Film Processes," Vols. I and II, Wiley & Sons.

By epitaxially growing the piezoelectric film for the acoustic cavity of the thin film resonator, the piezoelectric film reduces loss in the TFR due to grain boundaries in the film. In some embodiments of the TFR, a piezoelectric film for the acoustic cavity of the film can include a first piezoelectric film epitaxially grown with respect to a first growing surface or substrate adjacent to a second piezoelectric film having a different crystalline orientation and epitaxially grown with respect to a second growing surface or substrate. Moreover, a first piezoelectric film epitaxially grown on a first growing surface can be adjacent to a non-epitaxially grown film on a second growing surface. In such embodiments, the first and second piezoelectric films are different, and/or the growing surfaces or substrates are different.

The single crystal Si substrate 40 can be formed from commercially available single crystal Si wafers which are about 0.5–1 millimeter thick. To epitaxially form a piezoelectric film on the substrate 40 according to an embodiment of the present invention, a mask 42 is deposited on the substrate 40, such as a mask of silicon nitride $Si_3N_4$. Other masks could be used which are resistant to the etch subsequently used on the substrate 40. The mask 42 can be deposited for example using low pressure chemical vapor deposition (LPCVD) or other deposition techniques. See, Kern & Vossen, "Thin Film Processes," Vols. I and II, Wiley & Sons.

Figure 3:
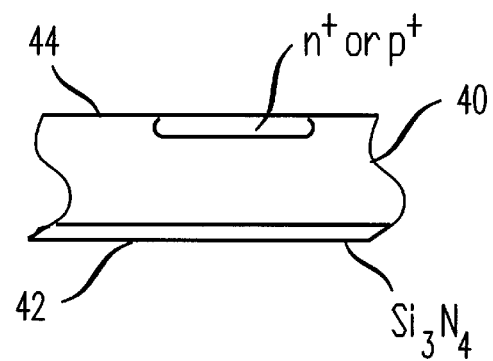

As shown in FIG. 3, an etch stop 44 is produced on the substrate 40 for use in resisting the subsequent anistropic or isotropic etching of the substrate 40. Depending on the dopant, the substrate, and the etchant, the type of etch stop can vary. The etch stop 44 can be produced by epitaxial growth or ion implantation, for example to produce a phosphorus or boron-doped n+ or p+ etch stop 44 having a dopant level of greater than $10^{20}$ atoms per cubic centimeter. Other etch stops or dopant concentrations are possible.

Figure 4A:
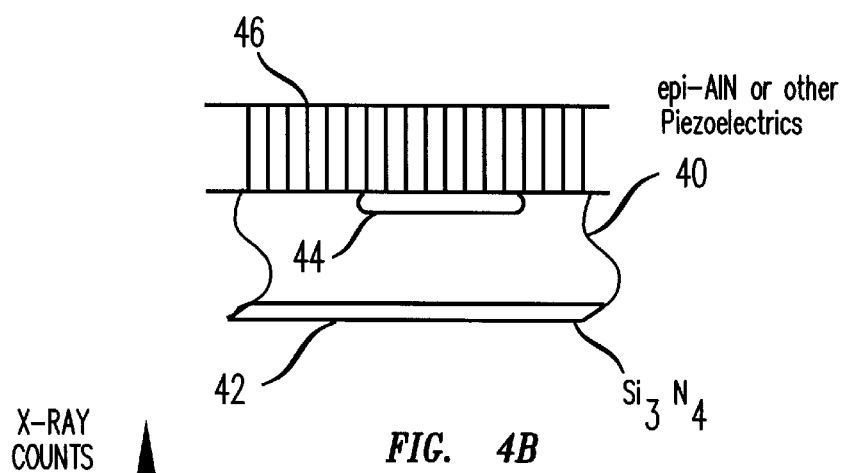

At FIG. 4a, a piezoelectric crystalline film 46, such as aluminum nitride (AlN), is epitaxially grown on the substrate 40. The piezoelectric film 46 can be epitaxially grown on the substrate 40 using molecular beam epitaxy (MBE). In one embodiment, Si (111) is used as the substrate on which the AlN film is epitaxially formed with the c axis of the film along the direction of growth. To do so, the Si (111) substrate is cleaned in buffered oxide etch (BOE), spun dry in air, and loaded into the MBE vacuum. In the MBE vacuum, the substrate is heated to 950 degrees celsius to desorb the residual oxide from the substrate. The clean Si (111) substrate is lowered to 800 degrees celsius, whereby the Si (111) 7×7 silicon surface reconstruction shows a reflecting high energy electron diffraction (RHEED) pattern which indicates a clean (111) surface ready for epitaxial growth. The AlN film is nucleated at a substrate temperature of 600–800 degrees celsius to a thickness of 100 angstroms using a growth rate of 775 angstroms per hour. The substrate is then raised to a temperature of 920 degrees celsius for 200 angstroms more growth of AlN at 775 angstroms per hour. Finally, the substrate is further raised to 980–1020 degrees celsius to complete the growing of the AlN film again at 775 angstroms per hour.

Because MBE is performed in a good vacuum, for example, better than $10^{-10}$ Torr, the film 46 can be produced with less contamination, resulting in fewer defects. The defects produce scattering of the acoustic energy which results in acoustic losses. Other methods can be used to epitaxially produce the film 46 on the substrate 40, such as sputtering and metallo organic chemical vapor deposition (CVD). See, Kern & Vossen, "Thin Film Processes," Vols. I and II, Wiley & Sons.

Because the piezoelectric film 46 is epitaxially formed on the substrate 40 which has a continuous crystalline orientation, the piezoelectric film 46 is produced having a continuous crystalline orientation, such as a single crystal AlN film 46, with relatively few or no grain boundaries along the substrate. The epitaxial film 46 may have dislocations or other imperfections, but these defects can also be reduced if the substrate is epitaxially formed on the substrate 40 which has suitable lattice mismatch and a continuous crystalline orientation.

Figure 4B:
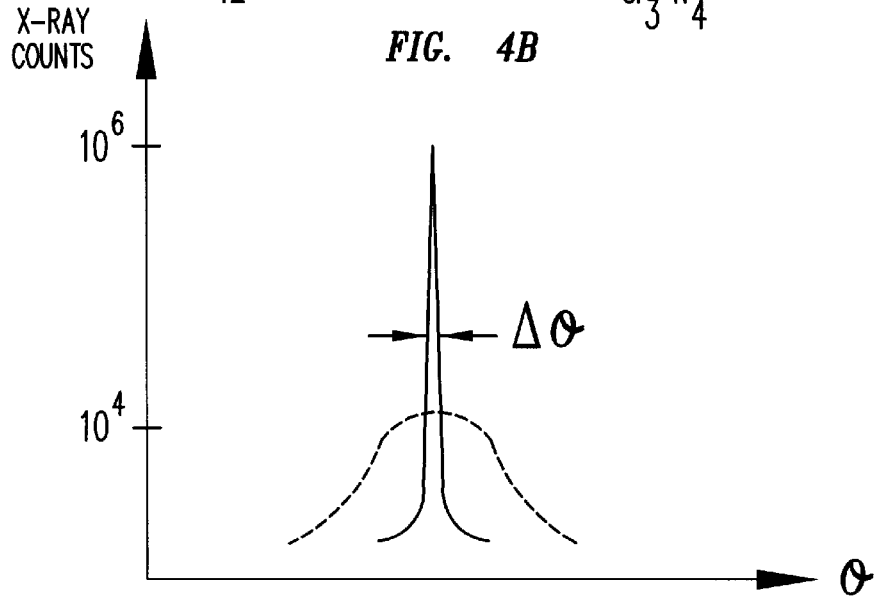
FIG. 4b shows example representations of x-ray diffraction peaks for epitaxial and non-epitaxial piezoelectric film.

The piezoelectric film 46 can be scanned using x-ray diffraction microscopy to determine if the piezoelectric film is uniformly oriented and has a low defect density. The sharpness or width of the diffraction peak can measure whether the film is highly oriented, for example a diffraction peak less than 1 degree thick throughout the film, indicates a film having a continuous crystalline orientation. FIG. 4b shows an example of an x-ray diffraction peak for an epitaxial piezoelectric film with a $\Delta\theta$ of 0.5 degree and an intensity of $10^6$ counts. The dashed line shows an example x-ray diffraction peak for a non-epitaxial piezoelectric film with a x-ray diffraction peak about 3 degrees wide and an intensity of $10^4$ counts. The intensity of the peak can provide an indication of the defect density. A diffraction peak with high intensity, for example greater than $10^6$ counts of diffracted x-ray photons relative to a constant flux applied to the film, indicates indirectly a low defect density. As shown in FIG. 4b, typical non-epitaxial film has an intensity on the order of $10^4$ counts. A transmission electron microscope (TEM) or defect etching can be used to determine the defect density of the film. In using a TEM, a portion of the crystalline material is sliced off and thinned down to a thickness through which electrons can pass. Because the defects have a different transmission coefficient than the surrounding material, defects can be detected by electron counts. Defect etching involves using a chemical etch to enhance the film defects which have a different etching rate than the surrounding material. Then, the defects are simply counted.

Figure 5:
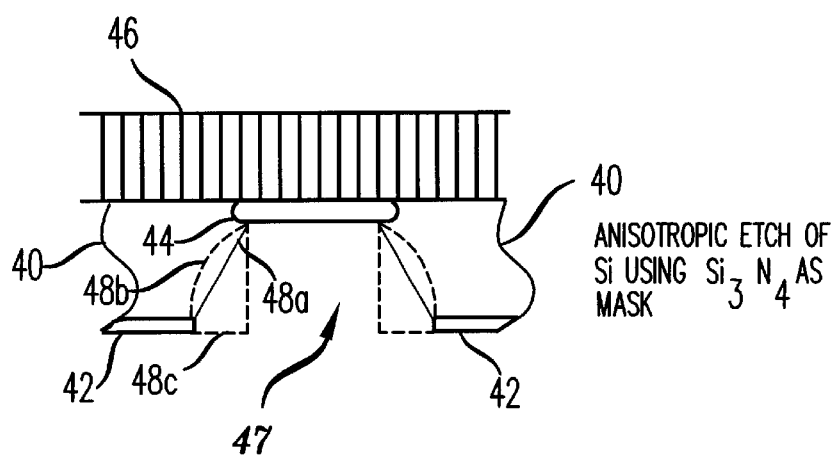

As shown in FIG. 5, a portion 47 of the silicon substrate 40 is removed from under the film 46 using an anisotropic or isotropic etch after removing a portion of the silicon nitride mask 42. Depending on the substrate, different etchants can be used. With a silicon substrate, an anisotropic etch can be performed using ehylene damine procatechol (EDP). For example, EDP at 100 degrees celsius would give an etching rate of silicon at 50–80 micron per hour. An anisotropic etch can also be performed using potassium hydroxide (KOH) at 80 degrees celsius to achieve the same etching rate. Alternatively, an isotropic etch can be performed for example using plasma etching if using a chromium (Cr) mask. The silicon etches typically attack most metals, including aluminum and aluminum nitride.

Consequently, in this embodiment, the etch stop 44 protects the AlN film 46 from the etch. Dashed lines 48 show the effects of different types of etches on the substrate 40. Dashed line 48a illustrates the effects of an anisotropic etch using for example EDP or KOH, dashed line 48b shows the effects of an isotropic etch, and dashed line 48c shows the effects of other anistropic etches, for example using reactive ion etching (RIE), to achieve a different etching profile. The etch stop 44 acts by not being substantially etched under the conditions used to etch the underlying layer.

Figure 6:
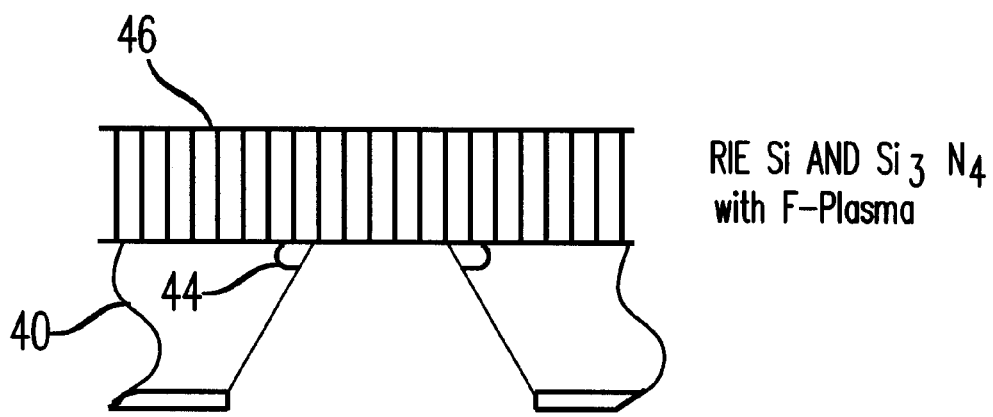

As shown in FIG. 6, the etch stop 44 and the remaining mask 42 can be removed by reactive ion etching (RIE) with Fluorine chemistry which attacks the silicon but stops at the AlN film 46 in this embodiment. In alternative embodiments, the etch stop 44 is not removed. Depending on the materials, other etching techniques can be used.

Figure 7:
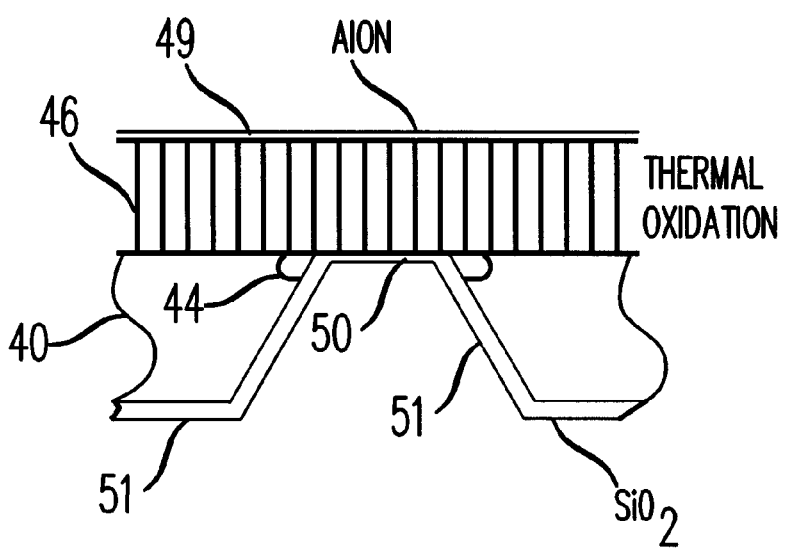
Figure 8:
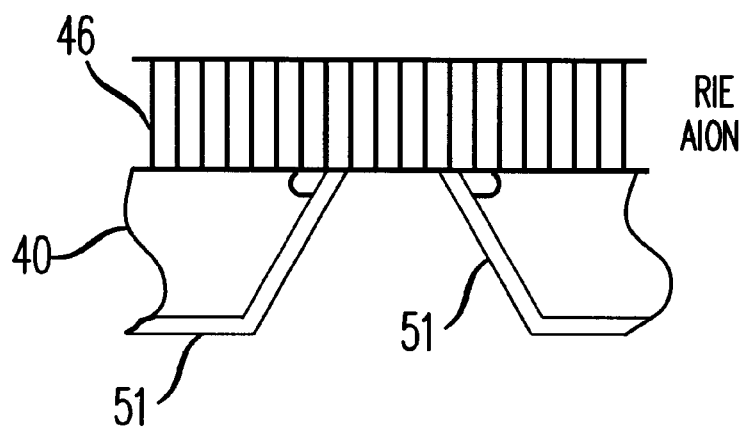

After the piezoelectric film 46 is exposed, the film 46 and the remaining substrate 40 are oxidized, for example using thermal oxidation or anodization, as shown in FIG. 7. The silicon oxide layer is added to provide electrical isolation of the electrodes from the silicon substrate. Non-conducting substrates, such as GaAs and aluminum oxide, would not require isolation form the electrodes. In this embodiment, since the piezoelectric film 46, for example of AlN, has a low oxidation rate when compared to the substrate 40, for example of silicon, thin layers 49 and 50 of aluminum oxinitrite (AlON), for example 100–200 angstroms thick, are produced on the AlN film 46. The silicon substrate is oxidized to form a layer 51 of silicon dioxide ($SiO_2$), for example of 1000–2000 angstroms thick. The AlON layers 49 and 50 on the top and bottom of the film 46 are removed using chlorine based chemistry which has little effect on the layer 51 of silicon dioxide as shown in FIG. 8. In alternative embodiments, the layers 49 and 50 can be selectively etched to remove the layer 49 and/or the layer 50, or both layers 49 and 50 can be retained.

Figure 9:
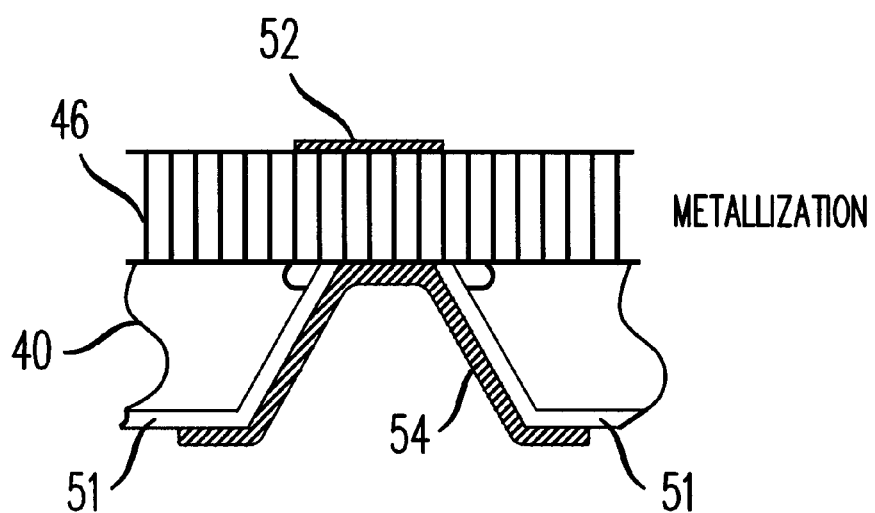

As shown in FIG. 9, electrodes 52 and 54, such as aluminum or other metal electrodes, are produced on either side of the film 46 to form a capacitor with the film 46. The electrodes 52 and 54 are deposited by sputtering which is typically performed using Argon gas as a sputtering gas, for example using a M2000 sputtering system from Novellus of Santa Clara Calif., USA. As would be understood by one of skill in the art, this type of sputtering involves placing an electric field and Argon between the TFR being fabricated and an aluminum (Al) target. The Argon ions are attracted to the Al target and bombard the Al target, releasing Al ions and neutral species which are deposited on the top and/or bottom (as well as the substrate 40) of the film 46. Other electrode deposition techniques can be used, such as chemical vapor deposition (CVD).

Thus, an improved thin film resonator is produced with less grain boundaries to reduce losses introduced by the TFR to electrical signals at certain frequencies corresponding to the resonant frequencies of the TFR, for example 0.1 to 10 GHz. For other frequencies, the film can be formed with different thicknesses. In addition to the embodiment described above, alternative embodiments of the method of fabricating the TFR are possible which omit and/or add steps and/or use variations or portions of the described method. Additionally, alternative embodiments of the resulting TFR are possible which add and/or omit layers and/or structures and/or use variations or portions of the described TFR. For example, the layer 48 and/or 49 can be removed and/or retained before the electrodes 52 and 54 are deposited. Moreover, additional layers of for example reflecting layers can be included in the manufacturing of the TFR or subsequently added to the TFR. The TFR is described as being fabricated with particular materials and using particular etches, but alternative materials and etches can be used to fabricate the TFR according to the principles of the present invention. For example, other piezoelectric crystalline films, such as zinc oxide, as well as other piezoelectric materials can be used.

The TFR is described with the piezoelectric film being grown on a single crystal Si substrate but other growing surfaces are possible which epitaxially produce a uniform crystalline structure in the film based on the crystallographic orientation of the substrate or on the growing surface. For example, the film 12 can be epitaxially grown using graphoepitaxy in which case the electrode surface can be the growing surface which has been patterned or textured, for example with a periodic, regular pattern. The periodic regular patterned surface can be formed to emulate a surface of a single crystal substrate. A regular periodic pattern of mezas and/or grooves can be used as seeds for the piezoelectric film using spacing commensurate with the spacing of the lattice structure of the piezoelectric film, such as the same spacing or a multiple of the spacing between the parallel lattice planes. The pattern can be formed using lithographic and/or etching techniques. Growing processes could be similar to those described above or would be understood by one of skill in the art with the benefit of this disclosure. Using LEGO, a substrate or appropriate growing surface is adjacent to the electrode over which the piezoelectric film is grown as would be understood by one of skill in the art with the benefit of this disclosure. Alternatively, a single crystal electrode with the appropriate lattice structure could be used as an electrode on which the piezoelectric film is grown. As would be understood by one of ordinary skill in the art, the various materials making up the TFR and their respective physical characteristics can determine the order and manner of certain manufacturing steps and processes. For example, according to certain aspects of the present invention, such as in the embodiments just mentioned, the electrode can be deposited before the film.

What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing a thin film resonator apparatus, said method comprising the steps of:

providing a single crystal silicon substrate;

epitaxially growing a piezoelectric film on said substrate;

removing a portion of said substrate under said piezoelectric film; and depositing an electrode under said piezoelectric film.

2. The method of claim 1 further including the steps of:

providing an etch stop layer in said substrate before epitaxially growing said piezoelectric film on said substrate;

etching a portion of said substrate under said piezoelectric film up to said etch stop layer; and removing said etch stop layer before depositing the electrode under said piezoelectric film.

3. The method of claim 2 including before depositing said electrode and after etching said portion of said substrate the steps of:
   oxidizing said piezoelectric film and said substrate; and
   removing at least said oxidized layer on said second side of said piezoelectric film.

4. The method of claim 1, wherein the piezoelectric film comprises aluminum nitride.

5. The method of claim 1, wherein the step of epitaxially growing comprises performing molecular beam epitaxy.

* * * * *